(12) United States Patent
Shim et al.

(10) Patent No.: US 12,129,338 B2
(45) Date of Patent: Oct. 29, 2024

(54) THERMOSETTING RESIN COMPOSITION FOR SEMICONDUCTOR PACKAGE, PREPREG AND METAL CLAD LAMINATE USING THE SAME

(71) Applicant: LG CHEM, LTD., Seoul (KR)

(72) Inventors: Changbo Shim, Daejeon (KR); Seunghyun Song, Daejeon (KR); Hwayeon Moon, Daejeon (KR); Hyunsung Min, Daejeon (KR); Hee Yong Shim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 578 days.

(21) Appl. No.: 16/957,345

(22) PCT Filed: Apr. 9, 2019

(86) PCT No.: PCT/KR2019/004222
§ 371 (c)(1),
(2) Date: Jun. 23, 2020

(87) PCT Pub. No.: WO2019/199032
PCT Pub. Date: Oct. 17, 2019

(65) Prior Publication Data
US 2020/0332056 A1    Oct. 22, 2020

(30) Foreign Application Priority Data

Apr. 10, 2018 (KR) .......... 10-2018-0041697
Jun. 20, 2018 (KR) .......... 10-2018-0071076
Mar. 28, 2019 (KR) .......... 10-2019-0036078
Mar. 28, 2019 (KR) .......... 10-2019-0036079

(51) Int. Cl.
| | |
|---|---|
| C08G 73/12 | (2006.01) |
| B32B 5/26 | (2006.01) |
| B32B 7/027 | (2019.01) |
| B32B 7/12 | (2006.01) |
| B32B 15/08 | (2006.01) |
| B32B 15/14 | (2006.01) |
| B32B 15/20 | (2006.01) |
| B32B 27/38 | (2006.01) |
| C08G 59/56 | (2006.01) |
| C08G 59/68 | (2006.01) |
| C08J 5/24 | (2006.01) |
| C08K 3/36 | (2006.01) |
| C08K 5/5419 | (2006.01) |
| C08K 9/06 | (2006.01) |
| C08L 33/08 | (2006.01) |
| C08L 63/00 | (2006.01) |
| C08L 79/08 | (2006.01) |
| H01L 23/00 | (2006.01) |
| H01L 23/14 | (2006.01) |

(Continued)

(52) U.S. Cl.
CPC ............ *C08G 73/12* (2013.01); *B32B 5/26* (2013.01); *B32B 7/027* (2019.01); *B32B 7/12* (2013.01); *B32B 15/08* (2013.01); *B32B 15/14* (2013.01); *B32B 15/20* (2013.01); *B32B 27/38* (2013.01); *C08G 59/56* (2013.01); *C08G 59/686* (2013.01); *C08J 5/244* (2021.05); *C08J 5/249* (2021.05); *C08K 3/36* (2013.01); *C08K 5/5419* (2013.01); *C08K 9/06* (2013.01); *C08L 33/08* (2013.01); *C08L 63/00* (2013.01); *C08L 79/08* (2013.01); *H01L 23/145* (2013.01); *H01L 23/562* (2013.01); *H05K 1/0271* (2013.01); *H05K 1/0373* (2013.01); *B32B 2250/40* (2013.01); *B32B 2260/021* (2013.01); *B32B 2260/023* (2013.01); *B32B 2260/046* (2013.01); *B32B 2262/101* (2013.01); *B32B 2307/734* (2013.01); *B32B 2457/00* (2013.01); *B32B 2457/14* (2013.01); *C08J 2363/00* (2013.01); *C08J 2433/08* (2013.01); *C08J 2479/08* (2013.01); *C08K 2201/003* (2013.01); *C08K 2201/014* (2013.01); *C08L 2205/025* (2013.01); *C08L 2205/035* (2013.01); *H05K 2201/068* (2013.01)

(58) Field of Classification Search
CPC ............... C08L 33/00–26; C08L 63/00–10
See application file for complete search history.

(56) References Cited

U.S. PATENT DOCUMENTS 4,594,291 A    6/1986  Bertram et al.
5,312,878 A *  5/1994  Shiobara ............ C08G 59/3218
                                                525/487

(Continued)

FOREIGN PATENT DOCUMENTS

CN    107614608 A    1/2018
EP      1454973 A    9/2004

(Continued)

OTHER PUBLICATIONS

Partial machine translation of JP 2013-256547 A (2022).*
Partial machine translation of JP 2015-017247 A (2022).*
Partial machine translation of JP 2009-256626 A (2022).*
Daiwakasei Industry, "Bismaleimide group", online Nov. 30, 2023, https://www.daiwakasei.jp/en/products_bismaleimide.html, 2023.

*Primary Examiner* — Kregg T Brooks
(74) *Attorney, Agent, or Firm* — Bryan Cave Leighton Paisner LLP

(57) ABSTRACT

The present disclosure relates to a thermosetting resin composition for a semiconductor package including an amine compound containing a specific functional group, a thermosetting resin, a thermoplastic resin, and an inorganic filler, and having a glass transition temperature of 230° C. or less after curing, a prepreg including the thermosetting resin composition, and a metal clad laminate including the prepreg.

10 Claims, No Drawings

(51) Int. Cl.
    *H05K 1/02*           (2006.01)
    *H05K 1/03*           (2006.01)

(56) References Cited

U.S. PATENT DOCUMENTS

| | | | |
|---|---|---|---|
| 6,013,730 | A | 1/2000 | McGrail et al. |
| 6,242,083 | B1 | 6/2001 | McGrail et al. |
| 6,551,714 | B1 * | 4/2003 | Tobisawa ............ C08G 59/245 |
| | | | 525/481 |
| 10,351,700 | B2 | 7/2019 | Furukawa et al. |
| 10,371,612 | B2 | 8/2019 | Kashihara et al. |
| 2003/0148107 | A1 | 8/2003 | Suzuki et al. |
| 2008/0241578 | A1 * | 10/2008 | Lin ........................ C09K 21/12 |
| | | | 428/626 |
| 2010/0193961 | A1 * | 8/2010 | Konishi ................. C08L 83/00 |
| | | | 257/773 |
| 2011/0083890 | A1 | 4/2011 | Tanaka et al. |
| 2011/0149532 | A1 | 6/2011 | Takahashi |
| 2012/0190759 | A1 * | 7/2012 | Jing ........................ H04M 1/23 |
| | | | 29/428 |
| 2013/0330563 | A1 | 12/2013 | Kotake et al. |
| 2014/0367150 | A1 | 12/2014 | Inoue et al. |
| 2015/0037589 | A1 * | 2/2015 | Inoue ...................... C08L 63/00 |
| | | | 156/60 |
| 2015/0075852 | A1 | 3/2015 | Inoue et al. |
| 2016/0017141 | A1 | 1/2016 | Matsumoto et al. |
| 2017/0145251 | A1 * | 5/2017 | Ogawa .................... C08G 59/50 |
| 2018/0148555 | A1 | 5/2018 | Moon et al. |
| 2018/0199435 | A1 | 7/2018 | Ohnishi et al. |

FOREIGN PATENT DOCUMENTS

| | | | |
|---|---|---|---|
| EP | 2333010 | A1 | 6/2011 |
| EP | 2746287 | A1 * | 6/2014 ................ C07F 9/28 |
| JP | 63-275624 | A | 11/1988 |
| JP | 10501020 | A | 1/1998 |
| JP | 2002-249753 | A | 9/2002 |
| JP | 2009-256626 | A | 11/2009 |
| JP | 2010053278 | A | 3/2010 |
| JP | 2011-195742 | A | 10/2011 |
| JP | 2011-213784 | A | 10/2011 |
| JP | 2011219504 | A | 11/2011 |
| JP | 2012255059 | A | 12/2012 |
| JP | 2013-256547 | A | 12/2013 |
| JP | 2014070156 | A | 4/2014 |
| JP | 2014080493 | A | 5/2014 |
| JP | 2014193994 | A | 10/2014 |
| JP | 2015-17247 | A | 1/2015 |
| JP | 2015-63040 | A | 4/2015 |
| JP | 2016034996 | A | 3/2016 |
| JP | 2017057331 | A | 3/2017 |
| JP | 2017061609 | A | 3/2017 |
| JP | 2017-193614 | A | 10/2017 |
| KR | 10-20040023153 | A | 3/2004 |
| KR | 10-20050027775 | A | 3/2005 |
| KR | 10-0538176 | B1 | 12/2005 |
| KR | 10-20090071774 | A | 7/2009 |
| KR | 10-20140004677 | A | 1/2014 |
| KR | 10-1502653 | B1 | 3/2015 |
| KR | 10-20150044751 | A | 4/2015 |
| KR | 10-20160118962 | A | 10/2016 |
| KR | 10-20170084027 | A | 7/2017 |
| KR | 10-20170084991 | A | 7/2017 |
| KR | 10-20180027425 | A | 3/2018 |
| TW | 1290160 | B | 11/2007 |
| TW | I290160 | B | 11/2007 |
| TW | 201736494 | A | 10/2017 |
| WO | 2010/035445 | A1 | 4/2010 |
| WO | 2014132654 | | 9/2014 |
| WO | 2015-046921 | A1 | 4/2015 |

\* cited by examiner

THERMOSETTING RESIN COMPOSITION FOR SEMICONDUCTOR PACKAGE, PREPREG AND METAL CLAD LAMINATE USING THE SAME

CROSS-REFERENCE TO RELATED APPLICATION

This application claims the benefits of Korean Patent Applications No. 10-2018-0041697 filed on Apr. 10, 2018, No. 10-2018-0071076 filed on Jun. 20, 2018, No. 10-2019-0036079 filed on Mar. 28, 2019 and No. 10-2019-0036078 filed on Mar. 28, 2019 with the Korean Intellectual Property Office, the disclosure of which is incorporated herein by reference in its entirety.

TECHNICAL FIELD

The present disclosure relates to a thermosetting resin composition for a semiconductor package, a prepreg, and a metal clad laminate. More specifically, the present disclosure relates to a thermosetting resin composition for a semiconductor package capable of implementing a low glass transition temperature, low modulus, and a low coefficient of thermal expansion and minimizing warpage, and having excellent flowability, and a prepreg and a metal clad laminate including the same.

BACKGROUND OF ART

A copper clad laminate used in a printed circuit board according to the related art is manufactured by impregnating a glass fabric substrate with thermosetting resin varnish, semi-curing the substrate to form a prepreg, and then pressurizing and heating the prepreg together with a copper foil. The prepreg is used again for constructing a circuit pattern on this copper clad laminate and building up on the circuit pattern.

In recent years, demands for improvement in performance, thickness, and weight of electronic devices, communication devices, personal computers, smart phones, and the like have increased, and thus semiconductor packages also need to be thinned. At the same time, there is a growing need for thinner printed circuit boards for semiconductor packages.

However, rigidity of the printed circuit board is reduced due to decreased thickness, and warpage problems of the semiconductor package occur due to a difference in coefficient of thermal expansion between the chip and the printed circuit board. This warpage becomes more serious by a high-temperature process such as reflow in such a way that the printed circuit board is not restored to its original state.

In order to improve the warpage phenomenon, studies have been made on techniques for lowering the coefficient of thermal expansion of the substrate. For example, a technique of filling the prepreg with a high amount of filler has been proposed. However, there is a limitation in that flowability of the prepreg is reduced when the prepreg is merely filled with a high content of the filler.

Therefore, it is required to develop a prepreg and a metal clad laminate capable of a low coefficient of thermal expansion with excellent flowability while reducing the occurrence of warpage.

DETAILED DESCRIPTION OF THE INVENTION

Technical Problem

The present disclosure is to provide a thermosetting resin composition for a semiconductor package capable of implementing a low glass transition temperature, low modulus, and a low coefficient of thermal expansion and minimizing warpage, and having excellent flowability.

The present disclosure also provides a prepreg including the thermosetting resin composition for a semiconductor package.

The present disclosure also provides a metal clad laminate including the prepreg.

Technical Solution

There is provided a thermosetting resin composition for a semiconductor package, including an amine compound containing one or more of at least one kind of functional group selected from the group consisting of a sulfone group; a carbonyl group; a halogen group; a C1 to C20 alkyl group unsubstituted or substituted with a nitro group, a cyano group or a halogen group; a C6 to C20 aryl group unsubstituted or substituted with a nitro group, a cyano group or a halogen group; a C2 to C30 heteroaryl group unsubstituted or substituted with a nitro group, a cyano group or a halogen group; and a C1 to C20 alkylene group unsubstituted or substituted with a nitro group, a cyano group or a halogen group, a thermosetting resin, a thermoplastic resin, and an inorganic filler, wherein a glass transition temperature is 230° C. or less.

In addition, there is provided a prepreg prepared by impregnating the thermosetting resin composition for a semiconductor package into a fabric substrate.

Also, there is provided a metal clad laminate, including the prepreg; and a metal foil integrated with the prepreg by heating and pressurizing.

Hereinafter, the thermosetting resin composition for a semiconductor package, the prepreg using the same, and the metal clad laminate according to the specific embodiment of the present invention will be described in more detail.

According to an embodiment of the present disclosure, provided is a thermosetting resin composition for a semiconductor package, including an amine compound containing one or more of at least one kind of functional group selected from the group consisting of a sulfone group; a carbonyl group; a halogen group; a C1 to C20 alkyl group unsubstituted or substituted with a nitro group, a cyano group or a halogen group; a C6 to C20 aryl group unsubstituted or substituted with a nitro group, a cyano group or a halogen group; a C2 to C30 heteroaryl group unsubstituted or substituted with a nitro group, a cyano group or a halogen group; and a C1 to C20 alkylene group unsubstituted or substituted with a nitro group, a cyano group or a halogen group, a thermosetting resin, a thermoplastic resin, and an inorganic filler, wherein a glass transition temperature is 230° C. or less.

The present inventors have conducted a study on materials for a semiconductor package and found through experiments that a composition having the above-described characteristics can ensure excellent flowability, can achieve a low glass transition temperature, low modulus, and a low coefficient of thermal expansion (CTE), and can minimize warpage, thereby completing the present invention.

More specifically, the composition for a semiconductor package according to the embodiment includes an amine compound containing one or more of at least one kind of functional group selected from the group consisting of a sulfone group; a carbonyl group; a halogen group; a 01 to C20 alkyl group unsubstituted or substituted with a nitro group, a cyano group or a halogen group; a C6 to C20 aryl group unsubstituted or substituted with a nitro group, a cyano group or a halogen group; a C2 to C30 heteroaryl group unsubstituted or substituted with a nitro group, a cyano group or a halogen group; and a 01 to C20 alkylene group unsubstituted or substituted with a nitro group, a cyano group or a halogen group, and this amine compound exhibits relatively low reactivity by containing a strong electron-withdrawing group (EWG), so that a curing reaction of the thermosetting resin composition may be easily controlled.

In particular, the resin composition for a semiconductor package according to the embodiment includes the thermosetting resin in an amount of 400 parts by weight or less based on 100 parts by weight of the amine compound, so that the thermosetting resin can be uniformly cured to a sufficient level without being affected by the filler added at a high content. Accordingly, reliability of the final product may be enhanced, mechanical properties such as toughness may be increased, and a glass transition temperature may be lowered to 230° C. or less.

Conventionally, when the amine curing agent is added in an excess amount, like adding the thermosetting resin in an amount of 400 parts by weight or less based on 100 parts by weight of the amine curing agent, flowability and moldability are reduced due to excessive curing of the thermosetting resin. However, as described above, the specific amine curing agent containing the electron withdrawing group (EWG), whose reactivity is decreased, can suppress a rapid increase in the curing rate of the thermosetting resin even when added in an excess amount. Therefore, even when stored in the resin composition for a semiconductor package or in the prepreg obtained therefrom for a long period of time, high flowability can be exhibited and thus excellent moldability can be achieved.

The thermosetting resin may be included in an amount of 400 parts by weight or less, 150 parts by weight to 400 parts by weight, 180 parts by weight to 300 parts by weight, 180 parts by weight to 290 parts by weight, or 190 parts by weight to 290 parts based on 100 parts by weight of the amine curing agent. When the amine curing agent or the thermosetting resin is a mixture of two or more kinds, the amount of the thermosetting resin mixture may be 400 parts by weight or less, 150 parts by weight to 400 parts by weight, 180 parts by weight to 300 parts by weight, 180 parts by weight to 290 parts by weight, or 190 parts by weight to 290 parts based on 100 parts by weight of the amine curing agent mixture.

When the thermosetting resin is included in an excess amount exceeding 400 parts by weight based on 100 parts by weight of the amine curing agent, it is difficult to uniformly cure the thermosetting resin to a sufficient level due to an increase in curing density and the high content of the filler. Accordingly, reliability of the final product may be decreased, and mechanical properties such as toughness may be reduced.

The resin composition for a semiconductor package may have an equivalent ratio calculated by the following Equation 1 of 1.4 or more, 1.4 to 2.5, 1.45 to 2.5, 1.45 to 2.1, 1.45 to 1.8, or 1.49 to 1.75.

Equivalent ratio=total active hydrogen equivalent contained in the amine curing agent/total curable functional group equivalent contained in the thermosetting resin  [Equation 1]

More specifically, in Equation 1, the total active hydrogen equivalent contained in the amine curing agent is a value obtained by dividing a total weight (unit: g) of the amine curing agent by active hydrogen equivalent weight (g/eq) of the amine curing agent.

When the amine curing agent is a mixture of two or more kinds of compounds, the total active hydrogen equivalent can be obtained by dividing a weight (unit: g) by active hydrogen equivalent weight (g/eq) for each compound and adding them up.

The active hydrogen contained in the amine curing agent refers to a hydrogen atom contained in the amino group ($-NH_2$) present in the amine curing agent, and the active hydrogen can form a curing structure by a reaction with the curable functional group of the thermosetting resin.

In Equation 1, the total curable functional group equivalent contained in the thermosetting resin is a value obtained by dividing a total weight (unit: g) of the thermosetting resin by curable functional group equivalent weight (g/eq) of the thermosetting resin.

When the thermosetting resin is a mixture of two or more kinds of compounds, the total curable functional group equivalent can be obtained by dividing a weight (unit: g) by curable functional group equivalent weight (g/eq) for each compound and adding them up.

The curable functional group contained in the thermosetting resin refers to a functional group that forms a curing structure by a reaction with the active hydrogen of the amine curing agent, and the type of the curable functional group may be changed depending on the kind of the thermosetting resin.

For example, when an epoxy resin is used as the thermosetting resin, the curable functional group contained in the epoxy resin may be an epoxy group, and when a bismaleimide resin is used as the thermosetting resin, the curable functional group contained in the bismaleimide resin may be a maleimide group.

That is, the resin composition for a semiconductor package satisfying the equivalent ratio calculated by Equation 1 of 1.4 or more means that the amine curing agent is sufficiently contained so that all of the curable functional groups contained in the thermosetting resin can cause a curing reaction. Therefore, when the equivalent ratio calculated by Equation 1 in the resin composition for a semiconductor package is reduced to less than 1.4, it is difficult for the thermosetting resin to be uniformly cured to a sufficient level due to an influence of the filler added at a high content, resulting in a reduction of reliability and mechanical properties of the final product.

The amine compound may be an amine compound containing at least one functional group selected from the group consisting of a sulfone group; a carbonyl group; a halogen group; a C1 to C20 alkyl group unsubstituted or substituted with a nitro group, a cyano group or a halogen group; a C6 to C20 aryl group unsubstituted or substituted with a nitro group, a cyano group or a halogen group; a C2 to C30 heteroaryl group unsubstituted or substituted with a nitro group, a cyano group or a halogen group; and a C1 to C20 alkylene group unsubstituted or substituted with a nitro group, a cyano group or a halogen group, and 2 to 5 amine groups.

More specifically, the amine compound may include at least one compound selected from the group consisting of the following Chemical Formulae 1 to 3:

[Chemical Formula 1]

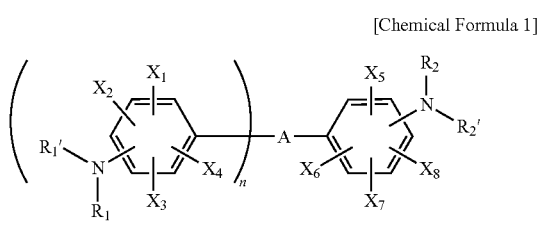

in Chemical Formula 1, A is a sulfone group, a carbonyl group, or a C1 to C10 alkylene group, $X_1$ to $X_8$ are each independently a nitro group, a cyano group, a hydrogen atom, a halogen group, a C1 to C6 alkyl group, a C6 to C15 aryl group, or a C2 to C20 heteroaryl group, $R_1$, $R_1'$, $R_2$ and $R_2'$ are each independently a hydrogen atom, a halogen group, a C1 to C6 alkyl group, a C6 to C15 aryl group, or a C2 to C20 heteroaryl group, and n is an integer of 1 to 10.

The C1 to C10 alkylene group, the C1 to C6 alkyl group, the C6 to C15 aryl group, and the C2 to C20 heteroaryl group may be independently substituted with at least one functional group selected from the group consisting of a nitro group, a cyano group and a halogen group.

[Chemical Formula 2]

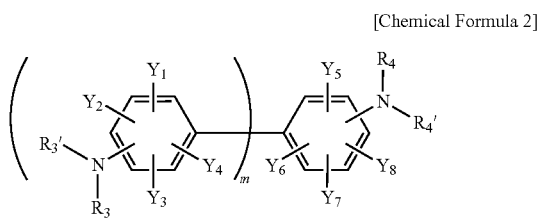

in Chemical Formula 2, $Y_1$ to $Y_8$ are each independently a nitro group, a cyano group, a hydrogen atom, a halogen group, a C1 to C6 alkyl group, a C6 to C15 aryl group, or a C2 to C20 heteroaryl group, $R_3$, $R_3'$, $R_4$ and $R_4'$ are each independently a hydrogen atom, a halogen group, a C1 to C6 alkyl group, a C6 to C15 aryl group, or a C2 to C20 heteroaryl group, and m is an integer of 1 to 10, and the C1 to C6 alkyl group, the C6 to C15 aryl group, and the C2 to C20 heteroaryl group may be independently substituted with at least one functional group selected from the group consisting of a nitro group, a cyano group and a halogen group.

[Chemical Formula 3]

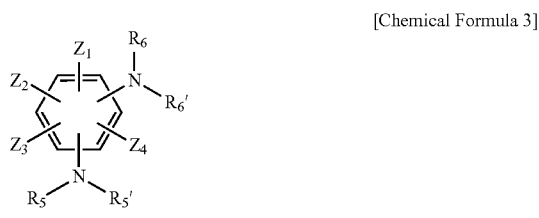

in Chemical Formula 3, $Z_1$ to $Z_4$ are each independently a nitro group, a cyano group, a hydrogen atom, a halogen group, a C1 to C6 alkyl group, a C6 to C15 aryl group, or a C2 to C20 heteroaryl group, $R_5$, $R_5'$, $R_6$ and $R_6'$ are each independently a hydrogen atom, a halogen group, a C1 to C6 alkyl group, a C6 to C15 aryl group, or a C2 to C20 heteroaryl group, and the C1 to C6 alkyl group, the C6 to C15 aryl group, and the C2 to C20 heteroaryl group may be independently substituted with at least one functional group selected from the group consisting of a nitro group, a cyano group and a halogen group.

The alkyl group is a monovalent functional group derived from an alkane, for example, a linear, branched or cyclic group such as methyl, ethyl, propyl, isobutyl, sec-butyl, tert-butyl, pentyl, hexyl, and the like. The hydrogen atom contained in the alkyl group may each be substituted with a substituent.

The alkylene group is a divalent functional group derived from an alkane, for example, a linear, branched or cyclic group such as a methylene group, an ethylene group, a propylene group, an isobutylene group, a sec-butylene group, a tert-butylene group, a pentylene group, a hexylene group, and the like. The hydrogen atom contained in the alkylene group may each be substituted with the same substituent as the alkyl group.

The aryl group is a monovalent functional group derived from an arene, for example, monocyclic or polycyclic. Specific examples of the monocyclic aryl group include, but are not limited to, a phenyl group, a biphenyl group, a terphenyl group, a stilbenyl group, and the like. Examples of the polycyclic aryl group include, but are not limited to, a naphthyl group, an anthryl group, a phenanthryl group, a pyrenyl group, a perylenyl group, a crycenyl group, a fluorenyl group, and the like. The hydrogen atom contained in the aryl group may each be substituted with the same substituent as the alkyl group.

The heteroaryl group is a heterocyclic group containing O, N or S, and the number of carbon atoms is not particularly limited, but may be 2 to 30. Examples of the heteroaryl group include, but are not limited to, a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a quinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a dibenzofuran group and the like. The hydrogen atom contained in the heteroaryl group may each be substituted with the same substituent as the alkyl group.

The term "substituted" means that another functional group is bonded in place of a hydrogen atom in the compound, and the position of substitution is not limited as long as it is a position at which a hydrogen atom is substituted, that is, a position at which a substituent may substitute, and when two or more substituents substitute, the two or more substituents may be the same as or different from each other.

More specifically, the Chemical Formula 1 may include a compound represented by the following Chemical Formula 1-1.

[Chemical Formula 1-1]

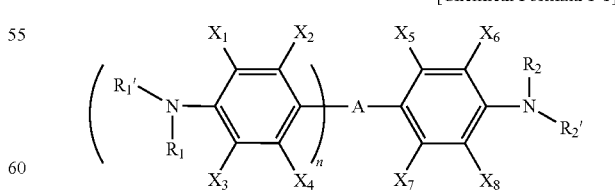

in Chemical Formula 1-1, A, $X_1$ to $X_8$, $R_1$, $R_1'$, $R_2$, $R_2'$, and n are as defined above in Chemical Formula 1.

Specific examples of the Chemical Formula 1-1 include 4,4'-diaminodiphenyl sulfone (wherein in Chemical Formula 1-1, A is a sulfone group, $X_1$ to $X_8$, $R_1$, $R_1'$, $R_2$ and $R_2'$ are each independently a hydrogen atom, and n is 1), bis(4-aminophenyl)methanone (wherein in Chemical Formula 1-1, A is a carbonyl group, $X_1$, $X_2$, $R_1$, $R_1'$, $R_2$ and $R_2'$ are each independently a hydrogen atom, and n is 1), 4,4'-(perfluoropropane-2,2-diyl)dianiline (wherein in Chemical Formula 1-1, A is perfluoropropane-2,2-diyl, $X_1$ to $X_8$, $R_1$, $R_1'$, $R_2$ and $R_2'$ are each independently a hydrogen atom, and n is 1), 4,4'-(2,2,2-trifluoroethane-1,1-diyl)dianiline (wherein in Chemical Formula 1-1, A is 2,2,2-trifluoroethane-1,1-diyl, $X_1$ to $X_8$, $R_1$, $R_1'$, $R_2$ and $R_2'$ are each independently a hydrogen atom, and n is 1), and the like.

In addition, the Chemical Formula 2 may include a compound represented by the following Chemical Formula 2-1.

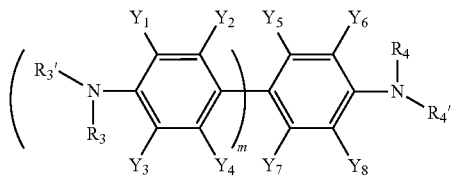

[Chemical Formula 2-1]

in Chemical Formula 2-1, $Y_1$ to $Y_8$, $R_3$, $R_3'$, $R_4$, $R_4'$, and m are as defined above in Chemical Formula 2.

Specific examples of the Chemical Formula 2-1 include 2,2',3,3',5,5',6,6'-octafluorobiphenyl-4,4'-diamine (wherein in Chemical Formula 2-1, $Y_1$ to $Y_8$ are halogen atoms, a fluorine group, $R_3$, $R_3'$, $R_4$ and $R_4'$ are each independently a hydrogen atom, and m is 1), 2,2'-bis(trifluoromethyl)biphenyl-4,4'-diamine ($Y_2$ and $Y_7$ are each independently a trifluoromethyl group, $Y_1$, $Y_3$, $Y_4$, $Y_5$, $Y_6$, and $Y_8$ are hydrogen atoms, $R_3$, $R_3'$, $R_4$ and $R_4'$ are each independently a hydrogen atom, and m is 1), and the like.

In addition, the Chemical Formula 3 may include a compound represented by the following Chemical Formula 3-1.

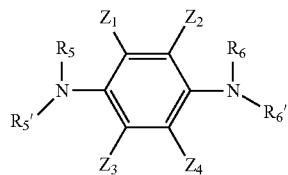

[Chemical Formula 3-1]

in Chemical Formula 3-1, $Z_1$ to $Z_4$, $R_5$, $R_5'$, $R_6$, and $R_6'$, are as defined above in Chemical Formula 3.

Specific examples of the Chemical Formula 3-1 include 2,3,5,6-tetrafluorobenzene-1,4-diamine (wherein in Chemical Formula 3-1, $Z_1$ to $Z_4$ are halogen atoms, a fluorine group, and $R_5$, $R_5'$, $R_6$ and $R_6'$ are each independently a hydrogen atom), and the like.

The thermosetting resin composition for a semiconductor package may have a glass transition temperature of 230° C. or less, 170 to 230° C., or 180 to 220° C. after curing, as the above-described components are included.

In addition, the thermosetting resin composition for a semiconductor package may have a storage modulus of 16 GPa or less at 30° C. and 180° C. measured after curing, respectively. The thermosetting resin composition for a semiconductor package may have a storage modulus of 8 GPa or less at 260° C. measured after curing.

The thermosetting resin composition for a semiconductor package has a low storage modulus of 16 GPa or less after curing at a relatively low temperature such as 30° C. and 180° C. Accordingly, it is possible to exhibit a relatively low stress at the same CTE, and thus to have relatively low warpage of the semiconductor package at temperatures as low as 30° C. and 180° C.

Since the thermosetting resin composition for a semiconductor package has a storage modulus within the above-described range at 260° C. after curing, it is possible to exhibit a relatively low stress at the same CTE, and thus to have relatively low warpage of the semiconductor package at a temperature of 260° C.

The thermosetting resin composition for a semiconductor package may have a coefficient of thermal expansion (CTE) of 12 ppm/° C. or less, 5 to 12 ppm/° C., or 4 to 10 ppm/° C. after curing.

The thermosetting resin composition for a semiconductor package according to the embodiment may include the amine compound, a thermosetting resin, a thermoplastic resin, and an inorganic filler.

The content of the above components is not particularly limited, but may be determined in consideration of physical properties of the final product prepared from the thermosetting resin composition for a semiconductor package according to the embodiment, and the content ratio between these components will be described later.

The thermosetting resin may include an epoxy resin. The epoxy resin is not limited as long as it is generally used in a thermosetting resin composition for a semiconductor package, and may be at least one selected from the group consisting of a bisphenol A type epoxy resin, a phenol novolac epoxy resin, a phenyl aralkyl-based epoxy resin, a tetraphenyl ethane epoxy resin, a naphthalene-based epoxy resin, a biphenyl-based epoxy resin, a dicyclopentadiene epoxy resin and a mixture of a dicyclopentadiene-based epoxy resin and a naphthalene-based epoxy resin.

Specifically, the epoxy resin may include at least one selected from the group consisting of a bisphenol type epoxy resin represented by the following Chemical Formula 5, a novolac type epoxy resin represented by the following Chemical Formula 6, a phenyl aralkyl type epoxy resin represented by the following Chemical Formula 7, a tetraphenyl ethane type epoxy resin represented by the following Chemical Formula 8, a naphthalene type epoxy resin represented by the following Chemical Formulae 9 and 10, a biphenyl type epoxy resin represented by the following Chemical Formula 11, and a dicyclopentadiene type epoxy resin represented by the following Chemical Formula 12.

[Chemical Formula 5]

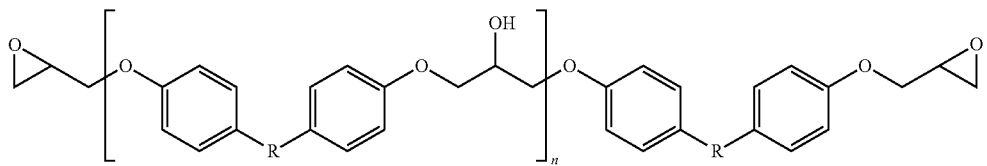

in Chemical Formula 5,
R is

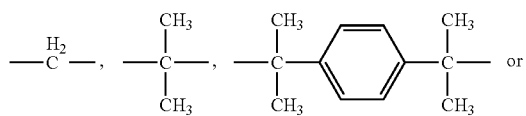

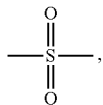

n is 0 or an integer of 1 to 50.

More specifically, the epoxy resin of Chemical Formula 5 may be a bisphenol A type epoxy resin, a bisphenol F type epoxy resin, a bisphenol M type epoxy resin, or a bisphenol S type epoxy resin, respectively, depending on the type of R.

[Chemical Formula 6]

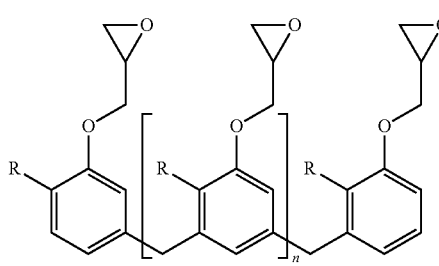

in Chemical Formula 6,
R is H or $CH_3$,
n is 0 or an integer of 1 to 50.

More specifically, the novolac type epoxy resin of Chemical Formula 6 may be a phenol novolac type epoxy resin or a cresol novolac type epoxy resin, respectively, depending on the type of R.

[Chemical Formula 7]

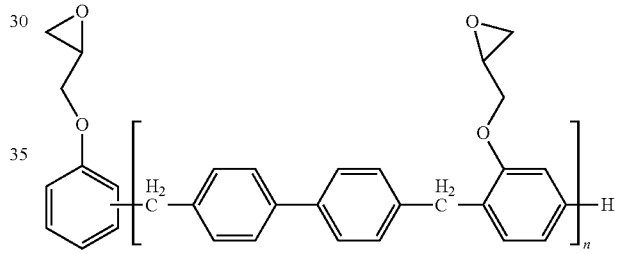

In Chemical Formula 7, n is 0 or an integer of 1 to 50,

[Chemical Formula 8]

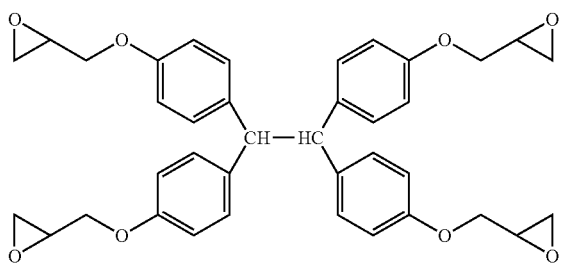

[Chemical Formula 9]

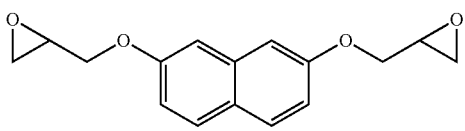

[Chemical Formula 10]

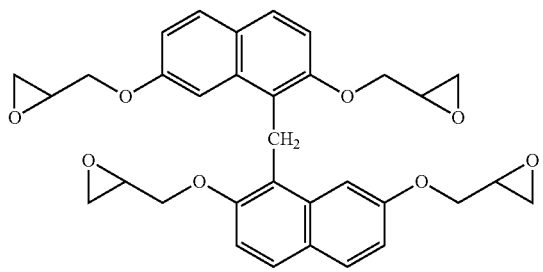

[Chemical Formula 11]

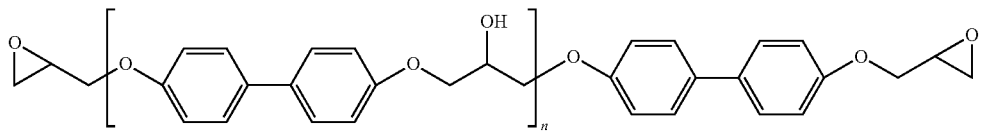

in Chemical Formula 11,
n is 0 or an integer of 1 to 50.

[Chemical Formula 12]

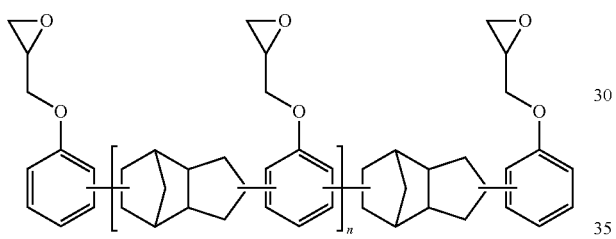

in Chemical Formula 12, n is 0 or an integer of 1 to 50.

Meanwhile, the thermosetting resin may further include at least one resin selected from the group consisting of a bismaleimide resin, a cyanate ester resin and a bismaleimide-triazine resin.

The bismaleimide resin is not limited as long as it is generally used in a thermosetting resin composition for a semiconductor package, and its type is not limited. For example, the bismaleimide resin may be at least one selected from the group consisting of a diphenylmethane type bismaleimide resin represented by the following Chemical Formula 13, a phenylene type bismaleimide resin represented by the following Chemical Formula 14, a bisphenol A type diphenyl ether bismaleimide resin represented by the following Chemical Formula 15, and a bismaleimide resin composed of oligomers of diphenylmethane type bismaleimide and a phenylmethane type maleimide resin represented by the following Chemical Formula 16.

[Chemical Formula 13]

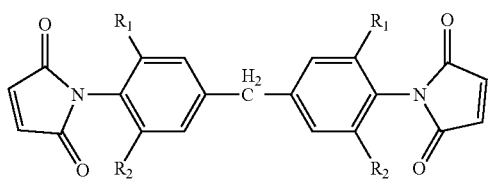

in Chemical Formula 13,
$R_1$ and $R_2$ are each independently H, $CH_3$ or $C_2H_5$.

[Chemical Formula 14]

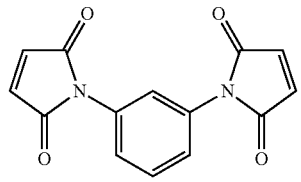

[Chemical Formula 15]

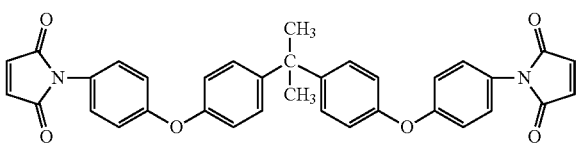

[Chemical Formula 16]

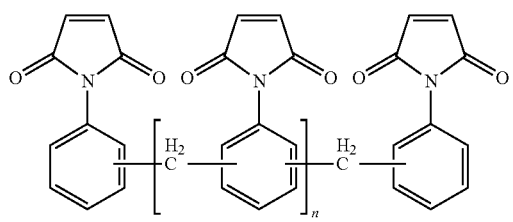

in Chemical Formula 16,
n is 0 or an integer of 1 to 50.

Specific examples of the cyanate-based resin include a cyanate ester resin, and the cyanate ester resin is not limited as long as it is generally used in a thermosetting resin composition for a semiconductor package.

For example, the cyanate ester resin may include a novolac type cyanate resin represented by the following Chemical Formula 17, a dicyclopentadiene type cyanate resin represented by the following Chemical Formula 18, a bisphenol type cyanate resin represented by the following Chemical Formula 19, and prepolymers in which a portion of the resin is formed into triazine. These may be used alone or in combination of two or more.

[Chemical Formula 17]

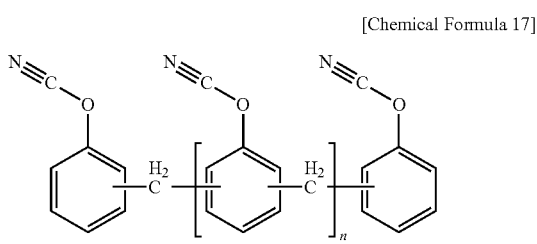

in Chemical Formula 17,
n is 0 or an integer of 1 to 50.

[Chemical Formula 18]

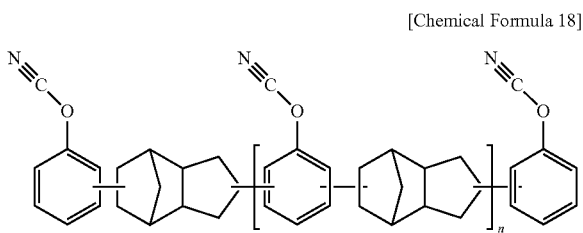

in Chemical Formula 18,
n is 0 or an integer of 1 to 50.

[Chemical Formula 19]

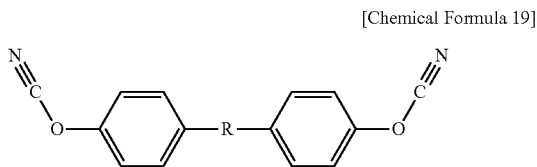

in Chemical Formula 19,
R is

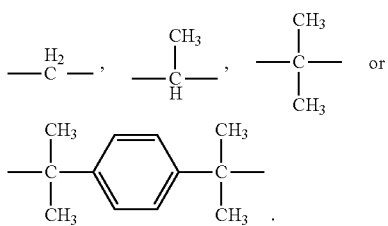

More specifically, the cyanate resin of Chemical Formula 19 may be a bisphenol A type cyanate resin, a bisphenol E type cyanate resin, a bisphenol F type cyanate resin, or a bisphenol M type cyanate resin, respectively, depending on the type of R.

Specific examples of the bismaleimide resin include a bismaleimide-triazine resin, and the bismaleimide-triazine resin is not limited as long as it is generally used in a thermosetting resin composition for a semiconductor package.

The thermoplastic resin may increase toughness of the prepreg after curing, and may lower the CTE and modulus, thereby reducing warpage of the semiconductor package. Specific examples of the thermoplastic resin include a (meth)acrylate-based polymer.

The (meth)acrylate-based polymer is not particularly limited, and for example, an acrylic acid ester copolymer containing a repeating unit derived from a (meth)acrylate-based monomer and a repeating unit derived from (meth)acrylonitrile; or an acrylic acid ester copolymer containing a repeating unit derived from butadiene. For example, the (meth)acrylate-based polymer may be a copolymer in which monomers such as butyl acrylate, ethyl acrylate, acrylonitrile, methyl methacrylate, and glycidyl methacrylate are copolymerized in the range of 1 to 40 wt % (based on a total weight of the monomers).

The (meth)acrylate-based polymer may have a weight average molecular weight of 500,000 to 1,000,000. When the weight average molecular weight of the (meth)acrylate-based polymer is too small, the increase in toughness of the prepreg after curing may be insignificant or the CTE and modulus may have a slight reduction, which is technically unfavorable. When the weight average molecular weight of the (meth)acrylate-based polymer is too large, flowability of the prepreg may be reduced.

The content of the thermoplastic resin may be determined in consideration of the use and characteristics of the final product. For example, the thermosetting resin composition for a semiconductor package may include 10 to 200 parts by weight of the thermoplastic resin based on 100 parts by weight of the thermosetting resin.

Meanwhile, the thermosetting resin composition for a semiconductor package according to the embodiment may include the above-described amine compound, and may further include an additional curing agent other than the amine compound.

More specifically, the thermosetting resin composition for a semiconductor package according to the embodiment may include at least one curing agent selected from the group consisting of a second amine compound different from the amine compound, an acid anhydride-based resin, a bismaleimide resin, a cyanate-based resin, a phenol novolac resin, and a benzoxazine resin.

Further, the thermosetting resin composition for a semiconductor package according to the embodiment may include an inorganic filler.

The inorganic filler is not limited as long as it is generally used in a thermosetting resin composition for a semiconductor package, and may be silica, aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, glass fine powder and hollow glass.

The thermosetting resin composition for a semiconductor package may include 30 to 300 parts by weight, 30 to 200 parts by weight, or 50 to 150 parts by weight of the inorganic filler based on 100 parts by weight of a total amount of the thermosetting resin, the thermoplastic resin and the amine compound. When the amount of the inorganic filler is too small, the CTE may be increased to cause warpage during reflow, and rigidity of the printed circuit board may be reduced.

In addition, when the surface-treated filler is used, both a small size filler with nano particle size and a large size filler with micro particle size are used together to increase packing density, resulting in high fillability.

The inorganic filler may include two or more kinds of inorganic fillers having different average particle diameters. Specifically, at least one of the inorganic fillers is an inorganic filler having an average particle diameter of 0.1 μm to 100 μm, and the other is an inorganic filler having an average particle diameter of 1 nm to 90 nm.

The amount of the inorganic filler having an average particle diameter of 1 nm to 90 nm may be 1 to 30 parts by weight based on 100 parts by weight of the inorganic filler having an average particle diameter of 0.1 µm to 100 µm.

The inorganic filler may be silica surface-treated with a silane coupling agent to improve moisture resistance and dispersibility.

As a method of surface-treating the inorganic filler, a method of treating silica particles dry or wet using a silane coupling agent as a surface treating agent may be used. For example, silica may be surface-treated by a wet method using 0.01 to 1 part by weight of a silane coupling agent based on 100 parts by weight of silica particles.

Specific examples of the silane coupling agent include an aminosilane coupling agent such as 3-aminopropyltriethoxysilane, N-phenyl-3-aminopropyltrimethoxysilane and N-2-(aminoethyl)-3-aminopropyltrimethoxysilane, an epoxy silane coupling agent such as 3-glycidoxypropyltrimethoxysilane, a vinyl silane coupling agent such as 3-methacryloxypropyltrimethoxysilane, a cation silane coupling agent such as N-2-(N-vinylbenzylaminoethyl)-3-aminopropyltrimethoxysilane hydrochloride, and a phenyl silane coupling agent. These may be used alone or in combination of two or more, if necessary.

More specifically, the silane compound may include aromatic aminosilane or (meth)acrylsilane. The inorganic filler having an average particle diameter of 0.1 µm to 100 µm may be silica treated with aromatic aminosilane and the inorganic filler having an average particle diameter of 1 nm to 90 nm may be silica treated with (meth)acrylsilane. Specific example of the silica treated with aromatic aminosilane may be SC2050MTO (manufactured by Admantechs), and specific example of the silica treated with (meth)acrylsilane may be AC4130Y (manufactured by Nissan chemical). The (meth)acryl includes both acryl and methacryl.

The thermosetting resin composition for a semiconductor package according to the embodiment may be used as a solution by adding a solvent, if necessary. The kind of solvent is not particularly limited as long as it has excellent solubility to resin components, and an alcohol-, ether-, ketone-, amide-, aromatic hydrocarbon-, ester-, or nitrile-based solvent, or the like may be used. These may be used alone or in combination of two or more. In addition, the content of the solvent is not particularly limited as long as the resin composition may be impregnated into a glass fabric at the time of preparing a prepreg.

The thermosetting resin composition for a semiconductor package may further include various other polymeric compounds such as other thermosetting resins, thermoplastic resins and oligomers and elastomers thereof, other flame retardant compounds or additives as long as inherent characteristics of the resin composition are not impaired. These are not limited as long as they are generally used in a thermosetting resin composition for a semiconductor package. Examples of the additives include an ultraviolet absorber, an antioxidant, a photopolymerization initiator, a fluorescent brightener, a photosensitizer, a pigment, a dye, a thickener, a lubricant, an antifoaming agent, a dispersant, a leveling agent, a brightener, and the like, and they may be mixed and used in accordance with the purpose.

According to another embodiment of the present disclosure, a prepreg including the thermosetting resin composition for a semiconductor package and a fabric substrate is provided.

The prepreg refers to a material in which the thermosetting resin composition for a semiconductor package is impregnated into the fabric substrate in a semi-cured state.

The kind of the fabric substrate is not particularly limited, but a glass fabric substrate, a synthetic fabric substrate made of a woven or nonwoven fabric having, as a main ingredient, a polyamide-based resin fiber such as a polyamide resin fiber or an aromatic polyamide resin fiber, a polyester-based resin fiber such as a polyester resin fiber, an aromatic polyester resin fiber or a wholly aromatic polyester resin fiber, a polyimide resin fiber, a polybenzoxazole fiber, or a fluororesin fiber, or a paper substrate having, as a main ingredient, craft paper, cotton linter paper, or mixed paper of linter and craft pulp may be used. Among them, the glass fabric substrate may be preferably used. The glass fabric substrate may improve strength of the prepreg and decrease water absorption and a coefficient of thermal expansion of the prepreg.

The glass fabric substrate may be selected from glass substrates used as materials for various printed circuit boards. Examples thereof may include glass fabric such as E glass, D glass, S glass, T glass, NE glass, L glass, and Q glass, but the present invention is not limited thereto. The glass substrate material may be selected according to the need, desired purpose, or performance. A form of the glass substrate is typically woven fabric, non-woven fabric, roving, a chopped strand mat, or a surfacing mat. A thickness of the glass substrate is not particularly limited, but a glass substrate having a thickness of about 0.01 to 0.3 mm may be used. Among the materials, a glass fiber material may be more preferable in view of strength and water absorption property.

Further, a preparation method of the prepreg is not particularly limited, and the prepreg may be prepared by a method well known in the art. For example, as the preparation method of a prepreg, an impregnation method, a coating method using various coaters, a spraying method, or the like, may be used.

In the case of the impregnation method, the prepreg may be prepared by preparing varnish and then impregnating the fabric substrate with the varnish.

That is, preparation conditions of the prepreg are not particularly limited, but it is preferable that the thermosetting resin composition for a semiconductor package is used in a varnish state in which a solvent is added thereto. The solvent for resin varnish is not particularly limited as long as it may be mixed with the resin components and have excellent solubility. Specific examples thereof may include ketones such as acetone, methyl ethyl ketone, methyl isobutyl ketone, and cyclohexanone, aromatic hydrocarbons such as benzene, toluene, and xylene, amides such as dimethyl formamide and dimethylacetamide, aliphatic alcohols such as methylcellosolve, butylcellosolve, and the like.

In addition, it is preferable that at least 80 wt % of the used solvent is volatilized at the time of preparing the prepreg. Therefore, there is no limitation in the preparation method or drying conditions, or the like. At the time of drying, a temperature may be about 80 to 200° C., and a time is not particularly limited due to a balance with a gelation time of the varnish. In addition, it is preferable that the varnish is impregnated so that a resin solid content of the varnish becomes about 30 to 80 wt % based on a total amount of a resin solid content of the varnish and the substrate.

According to another embodiment of the present disclosure, provided is a metal clad laminate including the prepreg having a sheet shape; and a metal foil formed on at least one surface of the prepreg.

The metal foil includes a copper foil; an aluminum foil; a three-layer composite foil having an intermediate layer of nickel, nickel-phosphorus, nickel-tin alloy, nickel-iron alloy, lead or lead-tin alloy and having copper layers with different thicknesses on both surfaces; or a two-layer composite foil in which an aluminum foil and a copper foil are combined.

According to a preferred example, the metal foil may be a copper foil or an aluminum foil having a thickness of about 2 to 200 μm, preferably about 2 to 35 μm. Preferably, the metal foil may be a copper foil. In addition, a three-layer composite foil in which a copper layer having a thickness of 0.5 to 15 μm and a copper layer having a thickness of 10 to 300 μm are laminated on both surfaces of an intermediate layer of nickel, nickel-phosphorus, nickel-tin alloy, nickel-iron alloy, lead or lead-tin alloy or a two-layer composite foil in which an aluminum foil and a copper foil are combined may be used as the metal foil.

At least one metal clad laminate including the prepreg prepared as described above may be laminated, and used to manufacture a double-sided or multi-layer printed circuit board. The double-sided or multilayer printed circuit board may be manufactured by processing a circuit on the metal clad laminate, and the circuit may be processed by a method performed in a manufacturing process of a general double-sided or multi-layer printed circuit board.

Advantageous Effects

The present disclosure may provide a thermosetting resin composition for a semiconductor package capable of implementing a low glass transition temperature, low modulus, and a low coefficient of thermal expansion and minimizing warpage, and having excellent flowability, and a prepreg prepared by using the same, and a metal clad laminate including the prepreg.

DETAILED DESCRIPTION OF THE EMBODIMENTS

Hereinafter, the present invention will be explained in detail with reference to the following examples. However, these examples are only to illustrate the invention, and the scope of the invention is not limited thereto.

Examples and Comparative Examples: Thermosetting Resin Composition for Semiconductor Package, Prepreg and Copper Clad Laminate (1) Preparation of Thermosetting Resin Composition for Semiconductor Package Components were mixed in methyl ethyl ketone at a solid content of 40% so as to have compositions as shown in the following Tables 1 and 2, and stirred at 400 rpm for one day at room temperature to obtain resin compositions (resin varnish) for a semiconductor package of Examples and Comparative Examples. Specifically, the specific composition of the resin composition prepared in the above Example is as shown in Table 1 below, and the specific composition of the resin composition prepared in the Comparative Example is as shown in Table 2 below.

(2) Preparation of Prepreg and Copper Clad Laminate

The resin composition (resin varnish) for a semiconductor package was impregnated into a glass fabric (T-glass #1010, manufactured by Nittobo) having a thickness of 13 μm and then hot-air-dried at a temperature of 170° C. for 2 to 5 minutes, thereby preparing a prepreg.

After two sheets of the prepregs prepared as described above were laminated, a copper foil (thickness: 12 μm, manufactured by Mitsui) was positioned and laminated on both surfaces thereof and cured at a temperature of 220° C. and a pressure of 35 kg/cm$^2$ for 100 minutes, thereby preparing a copper clad laminate.

Experimental Examples: Measurement of Physical Properties of Thermosetting Resin Composition for Semiconductor Package, Prepreg and Copper Clad Laminate Obtained in Examples and Comparative Examples Physical properties of the thermosetting resin compositions, prepregs, and copper clad laminates obtained in Examples and Comparative Examples were measured by the following methods, and the results are shown in Table 1 and Table 2 below.

1. Coefficient of Thermal Expansion (CTE)

The copper foil layer of the copper clad laminate obtained in the above Examples and Comparative Examples was removed by etching and then a test piece was prepared in a MD direction. Thereafter, a coefficient of thermal expansion (CTE) was measured from 30° C. to 260° C. at a heating rate of 10° C./min using TMA (manufactured by TA Instruments, Q400). The measured values in the range of 50° C. to 150° C. were listed as CTE.

2. Glass Transition Temperature (Tg)

The copper foil layer of the copper clad laminate obtained in the above Examples and Comparative Examples was removed by etching and then a test piece was prepared in a MD direction. Thereafter, a glass transition temperature (Tg) was measured from 25° C. to 300° C. at a heating rate of 5° C./min in a tensile mode using DMA (manufactured by TA Instruments, Q800). A peak temperature of tan delta was determined as Tg.

3. Measurement of Storage Modulus

The copper foil layer of the copper clad laminate obtained in the above Examples and Comparative Examples was removed by etching and then a test piece was prepared in a MD direction. Thereafter, storage modulus was measured from 25° C. to 300° C. at a heating rate of 5° C./min in a tensile mode using DMA (manufactured by TA Instruments, Q800).

4. Fillability of Circuit Pattern

The prepreg obtained in the above Examples and Comparative Examples was placed on both sides of a circuit pattern (pattern height: 7 μm, residual rate: 50%), and a copper foil (thickness: 12 μm, manufactured by Mitsui) was placed thereon. This was pressed for 100 minutes under conditions of 220° C. and 35 kg/cm$^2$, followed by etching the copper foil on both sides to evaluate fillability of the circuit pattern under the following criteria.

○: No void occurred
X: Void occurred

5. Measurement of Tensile Elongation 15 sheets of the prepregs obtained in the above Examples and Comparative Examples were laminated so as to the MD direction and the TD direction of the glass fabric coincided with each other. This was pressed for 100 minutes under conditions of 220° C. and 35 kg/cm$^2$, followed by measuring the tensile elongation in the MD direction using Universal Testing Machine (manufactured by Instron 3365) in accordance with IPC-TM-650 (2.4.18.3).

6. Measurement of Warpage of Semiconductor Package

A part of the copper foil of the copper clad laminate obtained in the above Examples and Comparative Examples was processed by a conventional etching method to prepare a printed circuit board (thickness: 90 μm). A semiconductor package (14.5 mm×14.5 mm×390 μm in thickness) was manufactured by mounting a semiconductor chip (11.5 mm×11.5 mm×80 μm in thickness) on the prepared printed circuit board. The warpage was measured on the basis of Shadow Moire measurement theory using a warpage measuring device (manufactured by AKROMETRIX, THERMOIRE PS100) for the manufactured semiconductor package. The warpage was measured for the semiconductor package from 30° C. to 260° C. and then cooled to 30° C. The difference between the maximum value and the minimum value was calculated, and the warpage of the semiconductor package was evaluated under the following criteria.

○: The difference between the maximum value and the minimum value of warpage is 170 μm or less X: The difference between the maximum value and the minimum value of warpage is more than 170 μm 7. Calculation of Thermal Stress Factor The thermal stress factor of the following General Formula 1 was calculated by integrating the product of the CTE (coefficient of thermal expansion) and the storage modulus at every 1° C. from 30° C. to 260° C.

Thermal Stress Factor (unit: MPa)∫[(Storage Modulus)×CTE]dT  [General Formula 1]

TABLE 1

Compositions of thermosetting resin composition (unit: g) and physical properties of prepreg, for Examples

| | | | Ex. 1 | Ex. 2 | Ex. 3 | Ex. 4 |
|---|---|---|---|---|---|---|
| Epoxy resin | XD-1000 (epoxy equivalent weight: 253 g/eq) | | 0 | 0 | 14 | 0 |
| | NC-3000H (epoxy equivalent weight: 290 g/eq) | | 46.1 | 39.48 | 33.5 | 12 |
| | HP-6000 (epoxy equivalent weight: 250 g/eq) | | | | | 24 |
| Bismaleimide | BMI-2300 (maleimide equivalent weight: 179 g/eq) | | 4.3 | 3.72 | 4.3 | 3.72 |
| Diamine compound | DDS (active hydrogen equivalent weight: 62 g/eq) | | 19.6 | 16.8 | 18.2 | 10.14 |
| | TFB (active hydrogen equivalent weight: 80 g/eq) | | | | | 10.14 |
| | DDM (active hydrogen equivalent weight: 49.5 g/eq) | | | | | |
| Thermoplastic resin | Acrylic rubber B (KG-3015P, Mw 800,000) | | 30 | | 30 | |
| | Acrylic rubber C (KG-3113, Mw 600,000) | | | 40 | | 40 |
| Inorganic filler | SC2050MTO | | 70 | 90 | 108 | 135 |
| | AC4130Y | | 0 | 10 | 12 | 15 |
| Equivalent ratio (diamine/epoxy) | | | 1.73 | 1.73 | 1.51 | 1.84 |
| Tg | | ° C. | 212 | 209 | 221 | 197 |
| CTE | | ppm/° C. | 9.1 | 8.5 | 8.1 | 7.8 |
| Fillability of circuit pattern | | | ○ | ○ | ○ | ○ |
| Storage modulus | 30° C. | GPa | 13.1 | 14.5 | 15.1 | 15.4 |
| | 180° C. | GPa | 9.7 | 11.2 | 11.6 | 11.8 |
| | 260° C. | GPa | 6.4 | 6.6 | 6.8 | 6.4 |
| Tensile elongation | | % | 4.1 | 3.9 | 3.8 | 3.6 |
| TSF | | MPa | 17.3 | 20.4 | 20.4 | 20.2 |
| Warpage | | μm | ○ | ○ | ○ | ○ |

TABLE 2

Compositions of thermosetting resin composition (unit: g) and physical properties of prepreg, for Comparative Examples

| | | | Comp. Ex. 1 | Comp. Ex. 2 | Comp. Ex. 3 | Comp. Ex. 4 |
|---|---|---|---|---|---|---|
| Epoxy resin | XD-1000 (epoxy equivalent weight: 253 g/eq) | | | 14.0 | 0 | 0 |
| | NC-3000H (epoxy equivalent weight: 290 g/eq) | | 65.8 | | 65.8 | 65.8 |
| | HP-6000 (epoxy equivalent weight: 250 g/eq) | | | 28.0 | | |
| Bismaleimide | BMI-2300 (maleimide equivalent weight: 179 g/eq) | | 6.2 | 16.8 | 6.2 | 6.2 |
| Curing agent | DDS (active hydrogen equivalent weight: 62 g/eq) | | | 11.2 | 28 | 28 |
| | TFB (active hydrogen equivalent weight: 80 g/eq) | | | | | |
| | DDM (active hydrogen equivalent weight: 49.5 g/eq) | | 28 | | | |
| Thermoplastic resin | Acrylic rubber B (KG-3015P, Mw 800,000) | | | 30 | | |
| | Acrylic rubber C (KG-3113, Mw 600,000) | | | | | |
| Inorganic filler | SC2050MTO | | 260 | 135 | 260 | 135 |
| | AC4130Y | | 0 | 15 | 0 | 15 |
| Equivalent ratio (diamine/epoxy) | | | 2.16 | 0.69 | 1.73 | 1.73 |
| Tg | | ° C. | 195 | 289 | 213 | 215 |
| CTE | | ppm/° C. | 9.8 | 7.8 | 9.6 | 11.6 |
| Fillability of circuit pattern | | | X | ○ | ○ | ○ |
| Storage modulus | 30° C. | GPa | 21.7 | 16.1 | 21.3 | 18.3 |
| | 180° C. | GPa | 18.2 | 15 | 19.2 | 16.6 |
| | 260° C. | GPa | 7.9 | 13.1 | 8.1 | 7 |
| Tensile elongation | | % | 2.4 | 3.1 | 2.6 | 3 |
| TSF | | MPa | 40.3 | 28.5 | 39.6 | 41.2 |
| Warpage | | μm | Inability to manufacture a substrate due to poor moldability | X | X | X |

*DDS: 4,4'-diaminodiphenyl sulfone *TFB: 2,2'-bis(trifluoromethyl)benzidine
*DDM: 4,4'-diaminodiphenyl methane *XD-1000: Epoxy resin (manufactured by Nippon kayaku)
*NC-3000H: Epoxy resin (manufactured by Nippon kayaku)
*HP-6000: Epoxy resin (manufactured by DIC) *BMI-2300: Bismaleimide-based resin (manufactured by DAIWA KASEI) *Acrylic rubber B (Mw 800,000): PARACRON KG-3015P (manufactured by Negami chemical industrial Co., LTD)
*Acrylic rubber C (Mw 600,000): PARACRON KG-3113 (manufactured by Negami chemical industrial Co., LTD) *Equivalent ratio: Calculated by the following Equation 1
[Equation 1] Equivalent ratio of amine compound to thermosetting resin = (total active hydrogen equivalent of DDS + total active hydrogen equivalent of TFB + total active hydrogen equivalent of DDM)/{(total epoxy equivalent of XD-1000 + total epoxy equivalent of NC-3000H + total epoxy equivalent of HP-6000) + (total maleimide equivalent of BMI-2300)}

In Equation 1, the total active hydrogen equivalent of DDS is a value obtained by dividing a total weight of DDS (unit: g) by active hydrogen equivalent weight of DDS (62 g/eq).

The total active hydrogen equivalent of TFB is a value obtained by dividing a total weight of TFB (unit: g) by active hydrogen equivalent weight of TFB (80 g/eq).

The total active hydrogen equivalent of DDM is a value obtained by dividing a total weight of DDM (unit: g) by active hydrogen equivalent weight of DDM (49.5 g/eq).

The total epoxy equivalent of XD-1000 is a value obtained by dividing a total weight of XD-1000 (unit: g) by epoxy equivalent weight of XD-1000 (253 g/eq).

The total epoxy equivalent of NC-3000H is a value obtained by dividing a total weight of NC-3000H (unit: g) by epoxy equivalent weight of NC-3000H (290 g/eq).

The total epoxy equivalent of HP-6000 is a value obtained by dividing a total weight of HP-6000 (unit: g) by epoxy equivalent weight of HP-6000 (250 g/eq).

The total maleimide equivalent of BMI-2300 is a value obtained by dividing a total weight of BMI-2300 (unit: g) by maleimide equivalent weight of BMI-2300 (179 g/eq).

As shown in Table 1, it was confirmed that the prepreg including an amine compound containing an electron withdrawing group (EWG) of Examples had excellent fillability of circuit pattern as well as a glass transition temperature of 230° C. or less and low CTE of 10 ppm/° C.

That is, it was confirmed that the resin composition of Examples including the thermosetting resin in an amount of 290 parts by weight or less based on 100 parts by weight of the amine compound containing an electron withdrawing group (EWG) and the inorganic filler in an amount of 50 to 150 parts by weight based on 100 parts by weight of a total amount of the thermosetting resin, the thermoplastic resin and the amine compound, wherein the equivalent ratio of amine compound to thermosetting resin is 1.4 or more, could achieve thermal properties, excellent low thermal expansion characteristics, flowability and mechanical properties suitable for a semiconductor package.

In the mean time, it was confirmed that each prepreg obtained in Examples had a thermal stress factor of 21 MPa or less, and a semiconductor package manufactured using the prepreg having such a thermal stress factor exhibited relatively low warpage. On the contrary, it was confirmed that each prepreg obtained in Comparative Examples had a thermal stress factor exceeding 25 MPa, and a semiconductor package manufactured using the prepreg having such a high thermal stress factor exhibited relatively high warpage.

The invention claimed is:

1. A thermosetting resin composition for a semiconductor package, comprising:
    an aromatic amine compound containing one or more of at least one kind of functional group selected from the group consisting of a sulfone group and a C1 to C20 alkyl group that is unsubstituted or substituted with a halogen group, and having 2 to 5 amine groups,
    a thermosetting resin,
    a thermoplastic resin comprising a (meth)acrylate-based polymer and having a weight average molecular weight of 500,000 to 800,000, and
    an inorganic filler in an amount of 50 to 150 parts by weight of the inorganic filler based on 100 parts by weight of a total amount of the thermosetting resin, the thermoplastic resin and the aromatic amine compound,
    wherein the thermosetting resin comprises at least one epoxy resin selected from the group consisting of a bisphenol A type epoxy resin, a phenol novolac epoxy resin, a phenyl aralkyl-based epoxy resin, a tetraphenyl ethane epoxy resin, a naphthalene-based epoxy resin, a biphenyl-based epoxy resin, a dicyclopentadiene epoxy resin and a mixture of a dicyclopentadiene-based epoxy resin and a naphthalene-based epoxy resin,
    wherein a glass transition temperature of the thermosetting resin composition after curing is 230° C. or less,
    wherein the thermosetting resin is included in an amount of from 150 parts by weight to 300 parts by weight based on 100 parts by weight of the amine compound, and
    wherein an equivalent ratio calculated by the following Equation 1 is 1.45 or more:

Equivalent ratio=total active hydrogen equivalent contained in the amine compound/total curable functional group equivalent contained in the thermosetting resin  [Equation 1].

2. The thermosetting resin composition for a semiconductor package of claim 1,
    wherein the thermosetting resin composition has a coefficient of thermal expansion (CTE) of 12 ppm/° C. or less after curing.

3. The thermosetting resin composition for a semiconductor package of claim 1,
    wherein the thermosetting resin composition has a storage modulus of 16 GPa or less at 30° C. and 180° C. measured after curing, respectively.

4. The thermosetting resin composition for a semiconductor package of claim 3,
    wherein the thermosetting resin composition has a storage modulus of 8 GPa or less at 260° C. measured after curing.

5. The thermosetting resin composition for a semiconductor package of claim 1,
    wherein the thermosetting resin further comprises at least one resin selected from the group consisting of a bismaleimide resin, a cyanate ester resin and a bismaleimide-triazine resin.

6. The thermosetting resin composition for a semiconductor package of claim 1,
    further comprising at least one curing agent selected from the group consisting of a second amine compound different from the amine compound, an acid anhydride-based resin, a phenol novolac resin, and a benzoxazine resin.

7. The thermosetting resin composition for a semiconductor package of claim 1,
    wherein the (meth)acrylate-based polymer is an acrylic acid ester copolymer containing a repeating unit derived from a (meth)acrylate-based monomer and a repeating unit derived from (meth)acrylonitrile; or an acrylic acid ester copolymer containing a repeating unit derived from butadiene.

8. The thermosetting resin composition for a semiconductor package of claim 1,
    wherein the inorganic filler comprises two or more kinds of inorganic fillers having different average particle diameters, and
    at least one of the two or more kinds of inorganic fillers is an inorganic filler having an average particle diameter of 0.1 μm to 100 μm, and at least one other is an inorganic filler having an average particle diameter of 1 nm to 90 nm.

9. A prepreg, comprising the thermosetting resin composition of claim 1 and a fabric substrate.

10. A metal clad laminate, comprising the prepreg of claim 9 having a sheet shape; and a metal foil formed on at least one surface of the prepreg.

* * * * *